Oct. 21, 1969 SHIN-ICHI OHASHI ET AL 3,474,307

SEMICONDUCTOR DEVICE FOR CHOPPER CIRCUITS HAVING LEAD WIRES OF COPPER METAL AND ALLOYS THEREOF

Filed March 25, 1966 2 Sheets-Sheet 1

INVENTORS
SHIN-ICHI OHASHI
TOSHIJIRO TAKAGI
ZENMON ABE

BY Paul M. Craig, Jr.
ATTORNEY

INVENTORS
SHIN-ICHI OHASHI
TOSHIJIRO TAKAGI
ZENMON ABE

BY Paul M. Craig, Jr.
ATTORNEY

United States Patent Office 3,474,307

Patented Oct. 21, 1969

3,474,307

SEMICONDUCTOR DEVICE FOR CHOPPER CIRCUITS HAVING LEAD WIRES OF COPPER METAL AND ALLOYS THEREOF

Shin-ichi Ohashi, Kodaira-shi, Toshijiro Takagi, Tokyo, and Zenmon Abe, Kokubunji-shi, Japan, assignors to Hitachi Ltd., Tokyo, Japan, a corporation of Japan Filed Mar. 25, 1966, Ser. No. 537,571

Claims priority, application Japan, Mar. 29, 1965, 40/17,811

Int. Cl. H01l *11/00, 15/00, 5/00*

U.S. Cl. 317—235 12 Claims

ABSTRACT OF THE DISCLOSURE

A field effect transistor arrangement for a chopper, wherein terminal wires which pass through and extend from a tap forming part of a closure for the transistor is formed with a meallic material having a small thermal electromotive force with respect to copper to reduce drift which may be generated at the output terminals of the chopper circuits.

This invention relates to semiconductor devices and more particularly to a novel structure for a semiconductor device for a chopper circuit.

Conventional DC–AC converters employing semiconductor devices have mainly been represented by diode and transistor type DC–AC converters. Drift and offset (hereinafter to be called drift for sake of simplicity) encountered with these choppers have mostly been caused by the diffusion potential and flow of backward saturation current at PN junctions, which amount to several hundredths of a volt in the diffusion potential and several microamperes, respectively. Due to the fact that this drift is considerably high, an effort has been made to reduce this drift and the prior effort has solely been directed to studies of a method such as differential connection.

On the other hand, however, a unipolar transistor, such as a field effect transistor, which is the product of recent studies and development is quite free from the prior problem of drift due to the diffusion potential and backward saturation current at the PN junction, and therefore drift of such a magnitude as in the prior case is substantially eliminated. Even with the above-described reduction in the drift, choppers including field effect transistors still have a drift which is several times to several ten times as great as that of mechanical choppers. Accordingly, field effect transistors could not be employed in DC–AC converters for use in electronic recorders in which the magnitude of drift must be lowered to a value comparable to that of mechanical choppers.

It is therefore the primary object of the present invention to provide a semiconductor device for chopper offset voltage or drift voltage of which are attributable to the thermal electromotive force produced in a semiconductor element, especially a field effect transistor can greatly be reduced. The field effect transistor according to the present invention is effective for application to chopper circuit and exhibits an especially marked effect when applied to means such as DC–AC converters and switching circuits.

According to the present invention, there is provided a field effect transistor for a chopper circuit including a field effect transistor element, means enclosing the field effect transistor element, gate, source and drain electrodes mounted on the transistor element, lead wires each connected at one end to a respective electrode, and terminal wires which pass through and extend from the means enclosing the transistor element, one end of each terminal wire being connected to the other end of a lead wire within the means enclosing the transistor element and at least one of the terminal wires being formed of a metallic material having a small thermal electromotive force with respect to copper to reduce the thermal electromotive force developed when the field effect transistor is connected to an external circuit.

The above and other objects, advantages and features of the present invention will become apparent from the folowing description with reference to the accompanying drawings, in which:

FIG. 1 is a partly sectional front elevation showing the structure of a transistor package;

FIGS. 2 through 5 and 10 through 12 are diagrammatic views showing various structures of the semiconductor device embodying the present invention;

As a result of basic experimental investigations on the cause of drift occurring in a semiconductor device, the inventors discovered that the following is the source of objectionable drift and devises a unique arrangement by virtue of which such source of drift was eliminated and a remarkable reduction in the drift could be attained. More precisely, external lead wires previously used in conventional semiconductor devices are mainly made from an iron alloy such as an iron-nickel alloy, Kovar or the like in order to obtain proper matching with the coefficient of thermal expansion of seal glass. Copper may be employed in lieu of the above iron alloy in case soft glass is used as the seal means, but in this case non-oxide contaminated copper must be used which has a peculiar feature that its surface oxidization would not take place for a long period of time, because otherwise the copper surface may gradually be oxidized and disengagement may take place at the contact portions between the lead wires and electrodes or between the external lead wires and slender lead wires extending from the electrodes. Further due to the fact that copper is relatively soft and weak, its mechanical strength is less than the above described iron alloy and it has a good thermal conductivity, electrodes can be welded only with relative difficulty and therefore its use is limited to hermetically sealed diodes, rectifier diodes and the like. It is the present practice that iron alloy is exclusively used for transistors.

Experimental investigations by the inventors disclosed the fact that, when a field effect transistor having such alloyed iron lead wires is used as a weak signal modulation element, a thermal electromotive force developed between an external switching circuit and the alloyed iron lead wires provides an important source of drift. An important feature of the present invention resides in forming the electrodes and electrode lead wires of a field effect transistor from a material which is same as that of an external switching circuit or from a material which has extremely small thermal electromotive force in order to reduce the objectionable drift.

Figure 1:
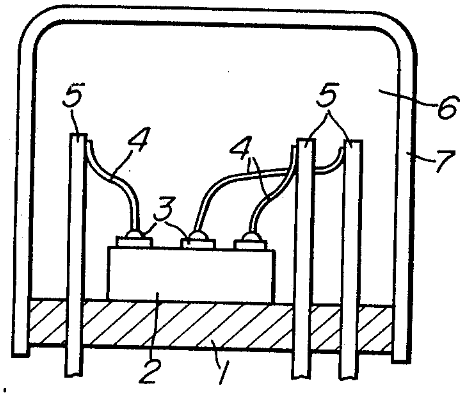

Referring now to FIG. 1 of the drawings, there is shown a transistor package structure which includes a seal portion or substrate 1, a field effect transistor 2 mounted on the substrate 1, electrodes 3 on the field effect transistor 2, lead wires 4 from the electrodes 3, external lead wires 5 and a heremetically sealed casing 7. An MOS or junction type field effect transistor may be used as the transistor 2. In the transistor package structure as described above, a thermal electromotice force develops at each of contact parts between the substrate of the field effect transistor 2 and the electrodes 3, between the electrodes 3 and the electrode lead wires 4, between the electrode lead wires 4 and the external lead wires 5, and between the external lead wires 5 and terminals of an external switching circuit. The magnitude of the thermal electromotive force between the field effect transistor and the electrodes is of the order of several hundreds of $\mu v$. per °C. in case the transistor 2 is formed from a semiconductor material such as germanium or silicon and the electrodes 3 are formed from a metal such as gold, silver or aluminum. On the other hand, the magnitude of the thermal electromotive forces between the electrodes 3 and the electrode lead wires 4, between the electrode lead wires 4 and the external lead wires 5, and between the external lead wires 5 and the terminals of the switching circuit are of the order of 10 to 50 $\mu$v. per °C. in case one of them is formed from an iron alloy and the other is formed from a metal such as copper, gold, silver or aluminum. When therefore such transistor is used as a weak signal modulator, drift of the order of several tens to several hundreds of $\mu v$. voltage depending on temperatures is developed due to the temperature difference between adjacent metals of two different kinds and the performance of the semiconductor device is thereby lowered. Briefly speaking, there are two solutions to deal with the above problem, that is, the above problem may be solved by (A) making the electrodes 3, the electrode lead wires 4, the external lead wires 5, the switching circuit terminals and the likes from a same metal material and by (B) providing zero temperature difference between the seal portion 1- lead wire 5 and the switching circuit terminals. As for the metal material referred to in (A), copper, copper alloys, zince solder and the like, or a metal having little thermal electromotive force such as gold or silver, or a metal or an alloy having a thermal electromotive force equivalent to that of gold or silver may be used since copper, copper alloys, zinc solder and the like are chiefly used to form the external switching circuit. In some cases, a metal material whose surface is thickly plated with one of these metals may be used.

Figure 2:
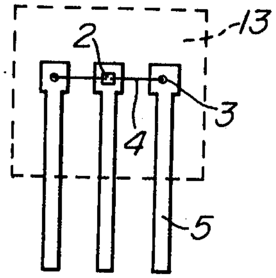

FIG. 2 is a sectional view showing part of the structure of an embodiment according to the invention, in which external lead wires 5 are made from copper or from a metal having little thermal electromotive force with respect to copper such as gold, silver or zinc and the entire device is sealed in a mass of plastic or ceramic material 13. For the external lead wires 5, copper not including any oxygen and other impurities therein, for example, non-oxide contaminated copper is especially suitable because no surface oxidization takes place for a long period of time in case of the above copper and such a trouble as disengagement of the lead wires 4 from the lead wires 5 at their contact parts would not result thereby.

Figure 3:
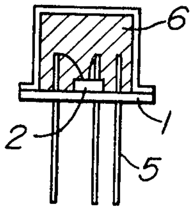

In FIG. 3 there is schematically shown part of another embodiment according to the invention. The embodiment shown in FIG. 3 is substantially similar to the heremetically sealed semiconductor device as shown in FIG. 1 except that the internal space of the transistor package is filled with an electrical insulator 6 having a good thermal conductivity such as silicon oil or silicon grease. In case the lead wires 5 are made from copper or a metal having little thermal electromotive force with respect to copper to thereby effect a greater reduction in the thermal electromotive force between the lead wires 5 and the switching circuit terminals than in the prior device, the only problem that remains is the thermal electromotice force in the interior of the transistor package. In this respect, it will be understood that filling the internal space with such electrical insulator as shown in FIG. 3 gives a great effect of reduction of the thermal electromotivce force. An effect entirely similar to the above may be obtained by employing for example a material of good thermal conductivity to form the substrate 1 supporting thereon the semiconductor device 2. In this connection, beryllium oxide ceramics may be extremely convenient for use as the material of good thermal conductivity by virtue of the advantage that its high electrical insulating property is suitable for a high-performance substrate and its characteristics with respect to generation of thermal electromotive force are quite satisfactory. It will be understood hat the remarkable effects as described above are derivable from the fact that the lead wires 5 are made from a material which has little thermal electromotive force with respect to copper, and not much of such effect can be expected from the prior case in which an iron alloy is used for the lead wires 5.

Figure 4:
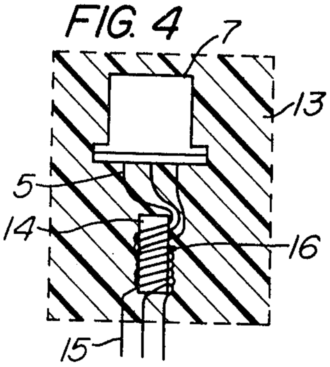

FIG. 4 presents still another embodiment according to the invention. In the embodiment of FIG. 4, first external lead wires 5 are made from the previously used iron alloy and second lead wires 15 made of material having little thermal electromotive force with respect to copper are connected with the first external lead wires 5. In order to minimize the temperature difference at contact parts 16 between the first lead wires 5 and the second lead wires 15 and to minimize conduction of external heat through the second lead wires 15 to the interior of a hermetically sealed casing 7, the first lead wires 5 and the second lead wires 15 are wound about a bar 14 of material of high thermal conductivity, and all these elements are sealed in a block 13 of plastic material. This arrangement is quite effective because little thermal electromotive force will develop at contact parts between the second lead wires 15 and external switching circuit terminals and any appreciable temperature difference will not develop in the elements in the block 13. In lieu of the above-described bar 14 of high thermal conductivity, a plate material of high thermal conductivity may be bent to hold therein the first lead wires 5 and the second lead wires 15 so as to substantially inhibit any external temperature variation from conducting inwardly by way of the second lead wires 15. However any other structure may be employed if such structure can effectively reduce inward conduction of heat by way of the second lead wires 15 and eliminate the temperature difference at the contact parts 16 between the first lead wires 5 and the second lead wires 15.

Figure 5:
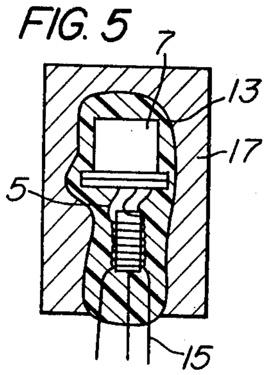

FIG. 5 shows a modification of the structure represented by FIG. 4 and the structure in FIG. 5 provides a further greater effect of preventing thermal conduction from the exterior and equalization of temperatures in the interior. More precisely, the semiconductor device with a hermetically sealed casing 7, first external lead wires 5, second external lead wires 15 and a bar 14 of material of high thermal conductivity is once covered by a block 13 of plastic insulator and is then sealed in a block 17 of low-melting metal material such as Wood's metal. This arrangement is advantageous in that temperature of the entire device is equalized by the metal material block 17 and further its mean temperature variation is suppressed by the plastic material block 13.

In the foregoing description, the external lead wires 5 in FIGS. 1 through 3 and the second lead wires 15 in FIGS. 4 and 5 are referred to as to be made from copper or a material having little thermal electromotive force with respect to copper. However, in view of the fact that the purpose of employment of such material is to minimize the thermal electromotive force developed due to the temperature difference between the external lead wires extending from the source and drain electrodes of the field effect transistor, such material may only be used for the external lead wires from the source and drain electrodes. Accordingly, the external lead wires to be connected with the gate electrode may not necessarily be formed from copper or a metal material having little thermal electromotive force with respect to copper.

Figure 6:
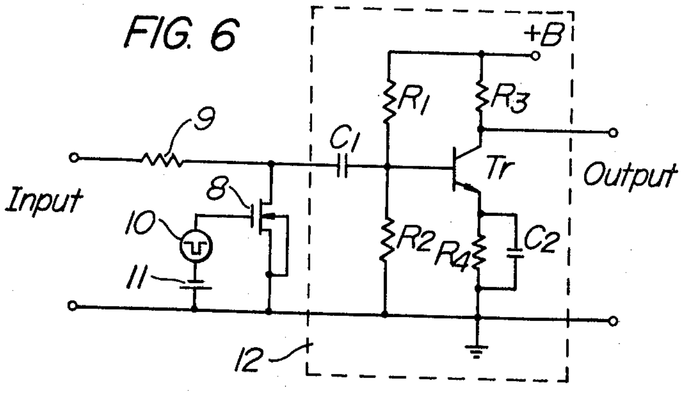
FIG. 6 is a schematic circuit diagram of a DC–AC converter in which the semiconductor device according to the invention is employed.

FIG. 6 shows an example of a circuit diagram when a field effect transistor of MOS type (metal oxide silicon type) is used as a DC-AC converter. In FIG. 6, reference numeral 8 denotes the above-described field effect transistor; 9, source impedance; 10, a modulator source; and 11, a source of DC bias voltage. Reference numeral 12 designates an AC amplifier of known structure which is composed of, for example, condensers $C_1$ and $C_2$, resistor elements $R_1$ to $R_4$ and a transistor $Tr$, and since operation of such AC amplifier is well known, no explanation will be given herein.

Figure 10:
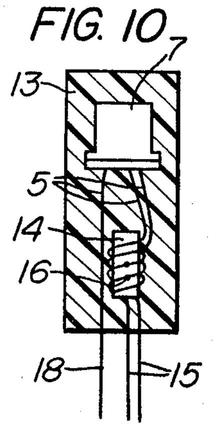

Suppose now that the frequency $f$ at the modular source 10 in FIG. 6 becomes higher than several hundred cycles per second. Then the frequency component at the modulator source 10 is supplied to the amplifier 12 through stray capacitance and inter-electrode capacitance between the source electrode and the gate electrode or between the drain electrode and the gate electrode of the unipolar transistor 8 to thereby provide a cause of offset and drift called spikes. In such a case, the above-described stray capacitance will increase to increase the offset and drift when the lead wires 5 from the source, gate and drain electrodes are disposed close to each other as shown in FIGS. 4 and 5. Taking into account the fact that the gate electrode need not be equalized in temperature with respect to the source and drain electrodes, an arrangement as shown in FIG. 10 may be made in which a lead wire portion 18 from the gate electrode among the first lead wires 5 and the second lead wires 15 is separated from the other lead wires and is not wound about the temperature equalizing bar 14. This arrangement provides a great effect of reduction in the above-described spikes.

Figure 11:
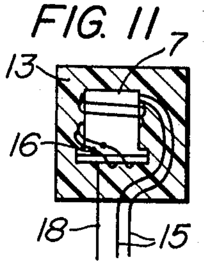

An embodiment shown in FIG. 11 is advantageous in that the entire device can be made small-sized while attaining the effect similar to that of FIG. 10. The structure shown in FIG. 11 differs from that of FIG. 10 in that the first lead wires 5 and the second lead wires 15 from the source and drain electrodes are coiled about the hermetically sealed casing 7 of the unipolar transistor instead of being coiled about the bar 14 of high thermal conductivity.

Lap winding of the lead wires from the source and drain electrodes as shown in FIGS. 10 and 11 gives an additional effect that self-inductances of the external lead wires from the source and drain electrodes cancel each other so that self-inductances of the external lead wires for the unipolar transistor are reduced and any degradation of its high-frequency response can thereby be prevented.

Figure 7:
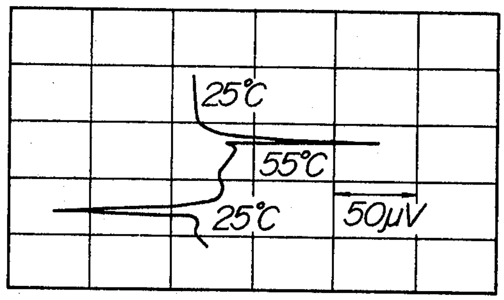
FIG. 7 is a graphic illustration of operational characteristics of a prior semiconductor device.
Figure 8:
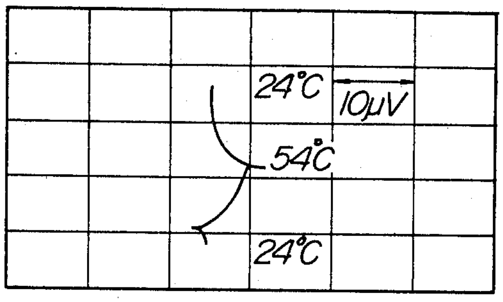
FIG. 8 is a graphic illustration of operational characteristics of the semiconductor device according to the invention.

FIG. 7 is a graphic illustration of temperature drift when the field effect transistor of MOS type in FIG. 6 is equipped with external lead wires 5 (FIG. 1) of a prior iron-nickel alloy. FIG. 8 represents a case in which such lead wires 5 are made from copper. Comparing FIG. 8 with FIG. 7, it will be apparent that the temperature drift in FIG. 8 is about one-fifth the temperature drift in FIG. 7 and an additional effect is derivable in that there is hardly no transient drift during abrupt variation in temperatures.

Figure 9:
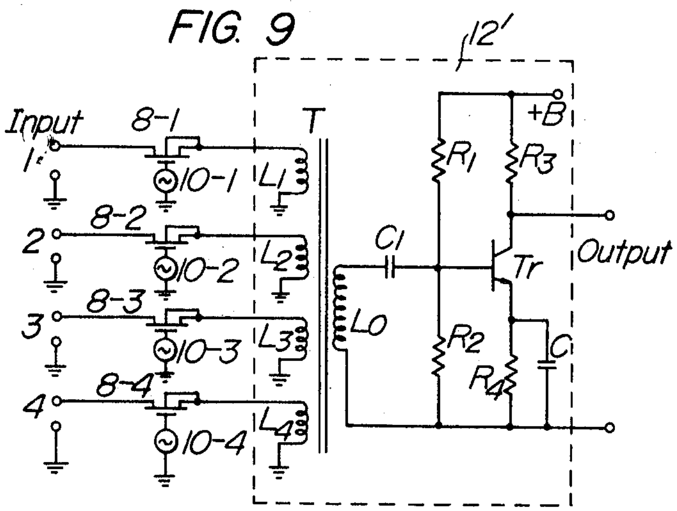
FIG. 9 is a schematic circuit diagram of another example in which the semiconductor device according to the invention is employed.
Figure 12:
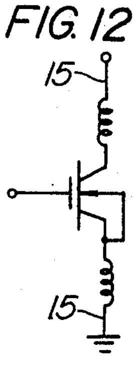

FIG. 9 is a basic diagram of an input circuit for means such as scanner switches in a data logger in which many input signals are successively switched over for sampling. Reference numerals 8–1 through 8–4 designate switches for successively switching over respective inputs 1 through 4 and these switches are formed by the field effect semiconductor devices according to the present invention. Control signals 10–1 through 10–4 are operative to successively actuate the respective switches 8–1 through 8–4. Reference numeral 12' designates amplifier means which is composed of, for example, a transformer T including primary windings $L_1$ to $L_4$ and a secondary winding $L_0$ and an amplifier of structure similar to the amplifier 12 shown in FIG. 6. Switches for use in such an analog circuit are generally required to have a drift and offset voltage of less than 1 $\mu$v. In connection with the above requirement, the use of the unipolar transistor device according to the present invention is highly preferred and advantageous owing to the fact that it has a quick response time compared with prior mechanical switches and yet its drift and offset voltage is comparable to that of the prior mechanical switches. For example, the on-off frequency of the switch formed by the unipolar transistor device according to the invention is 1 kc. to 10 kc. per second or more whereas the on-off frequency of the prior mechanical switch is only 50 to 400 cycles per second. The present invention can likewise advantageously be applied to various signal inverters wherein offset and drift of less than 1 $\mu$v. may even be a matter of grave consideration because of low input signal levels.

As will be apparent from the foregoing description, an iron alloy has priorly exclusively been used for lead wires from transistor electrodes and drift thereby produced must have been reduced. Even with the prior effort to reduce the drift, the drift has still been excessive in case of means such as a DC–AC converter or switches in an analog circuit, and the limit has been reached beyond which any improvement can not be attained.

Under such circumstances, the present invention provides an effective solution to the prior problems and makes possible to further reduce the drift beyond the prior limit even to a value approaching to zero and at the same time to quicken the response time of switches.

What we claim is:

1. A semiconductor device for a chopper including a field effect transistor element, means enclosing the field effect transistor element, gate, source and drain electrodes mounted on the transistor element, lead wires each connected at one end to a respective electrode, and terminal wires which pass through and extend from the means enclosing the transistor element one end of each terminal wire being connected to the other end of a lead wire within the means enclosing the transistor element and at least one of the terminal wires being formed of a metallic material having a small thermal electromotive force with respect to copper to reduce the thermal electromotive force developed when the field effect transistor is connected to an external circuit.

2. A semiconductor device as claimed in claim 1, in which the terminal wires consist substantially of copper.

3. A semiconductor device for chopper as claimed in claim 1, in which the terminal wires include an alloy containing copper.

4. A semiconductor device for chopper as claimed in claim 1, in which the terminal wires are selected from the group consisting of silver, gold, zinc, aluminum and alloys thereof.

5. A semiconductor device as claimed in claim 1, in which the means enclosing the transistor element is selected from the group consisting of plastic and ceramic material.

6. A semiconductor device as claimed in claim 1, in which the means enclosing the transistor element is a package containing thermally conducting and electrically insulating material to provide temperature equalization between the junction of the electrodes and the electrode lead wires and the terminal wires.

7. A semiconductor device as claimed in claim 1, in which at least one of the terminal wires includes a first wire portion connected to an electrode lead wire and a second wire portion connected to the first wire portion, the second wire portion being formed of a metallic material having a small electromotive force with respect to copper, the junction portion of the first and second wire portions being wound round a material located within the means enclosing the transistor element and having a high thermal conductivity to provide temperature equalization at the junctions between the first and second wire portion.

8. A semiconductor device as claimed in claim 1, in which at least one of the terminal wires includes a first wire portion connected to an electrode lead wire and a second wire portion connected to the first wire portion, the second wire portion including a metallic material having a small electromotive force with respect to copper, the junction portion of the first and second wire portions being wound round a material having a high thermal conductivity to provide temperature equalization at the junctions between the first and second wire portion.

9. A semiconductor device as claimed in claim 8 wherein said means enclosing the transistor element and said high thermal conductivity material are embedded in a body of organic plastic material.

10. A semiconductor device as claimed in claim 9 wherein said body of organic plastic material is embedded in a body of Wood's metal.

11. A semiconductor device as claimed in claim 8 wherein the terminal wire connected to the gate electrode of the field effect transistor is spaced from said terminal wires connected to the source and drain electrodes, the latter terminal wires being wound round said material of high thermal conductivity.

12. A semiconductor device as claimed in claim 11 wherein the terminal wires connected to said source and drain electrodes are wrapped round a closure element forming part of said means enclosing the transistor element.

References Cited

UNITED STATES PATENTS

| | | | |
|---|---|---|---|
| 2,844,772 | 7/1958 | Weil | 317—235 |
| 2,850,687 | 9/1958 | Hammes | 317—234 |
| 2,981,873 | 4/1961 | Eannarino et al. | 317—234 |
| 2,998,555 | 8/1961 | Klossika | 317—234 |
| 3,099,776 | 7/1963 | Henneke | 317—235 |
| 3,198,999 | 8/1965 | Baker et al. | 317—234 |
| 3,209,450 | 10/1965 | Klein et al. | 317—234 |
| 3,217,401 | 11/1965 | White | 317—234 |
| 3,312,771 | 4/1967 | Hessinger et al. | 317—234 |
| 3,377,522 | 4/1968 | Tsuji et al. | 317—235 X |

JOHN W. HUCKERT, Primary Examiner

A. J. JAMES, Assistant Examiner

U.S. Cl. X.R.

317—234